United States Patent
Agata et al.

(10) Patent No.: US 7,002,865 B2
(45) Date of Patent: Feb. 21, 2006

(54) NONVOLATILE SEMICONDUCTOR MEMORY DEVICE

(75) Inventors: Masashi Agata, Osaka (JP); Masanori Shirahama, Shiga (JP); Toshiaki Kawasaki, Osaka (JP); Ryuji Nishihara, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/935,278

(22) Filed: Sep. 8, 2004

(65) Prior Publication Data

US 2005/0052926 A1   Mar. 10, 2005

(30) Foreign Application Priority Data

Sep. 8, 2003   (JP)   ............................ 2003-315808

(51) Int. Cl.
  *G11C 7/02*   (2006.01)
(52) U.S. Cl. ................................. 365/207; 365/185.27
(58) Field of Classification Search ................ 365/207, 365/185.27, 185.14, 185.28
  See application file for complete search history.

(56) References Cited

U.S. PATENT DOCUMENTS

| 5,029,131 | A | * | 7/1991 | Vancu | ................... 365/185.03 |
| 5,754,477 | A | * | 5/1998 | Forbes | ................... 365/185.33 |
| 6,246,088 | B1 | * | 6/2001 | Chang | ........................ 257/314 |
| 6,614,684 | B1 | | 9/2003 | Shukuri et al. | |

* cited by examiner

*Primary Examiner*—Anh Phung

(74) *Attorney, Agent, or Firm*—McDermott Will & Emery LLP

(57) ABSTRACT

A nonvolatile semiconductor memory device includes: a first bit cell including a first MOS transistor whose source and drain are connected to form a first control gate and a second MOS transistor which has a floating gate in common with the first MOS transistor; a second bit cell including a third MOS transistor whose source and drain are connected to form a second control gate and a fourth MOS transistor which has a floating gate in common with the third MOS transistor; and a differential amplifier which receives input signals from drains of the respective second and fourth MOS transistors.

11 Claims, 7 Drawing Sheets

NONVOLATILE SEMICONDUCTOR MEMORY DEVICE

CROSS-REFERENCE TO RELATED APPLICATION

The disclosure of Japanese Patent Application No. 2003-315808 filed on Sep. 8, 2003 including specification, drawings and claims is incorporated herein by reference in its entirety.

BACKGROUND OF THE INVENTION

The present invention relates to nonvolatile semiconductor memory devices including MOS transistors.

Among nonvolatile semiconductor memory devices, flash memories, e.g., are frequently used as devices capable of retaining large amounts of data in a nonvolatile manner.

In flash memories, flash cells, each having a single transistor structure typically formed by stacking a control gate on a floating gate, are used. Along with finer design rules, however, fabrication process steps of flash memories have become more complicated and their processing cost has been increasing. In view of this, in the case of incorporating nonvolatile memories into a large-scale system LSI, it is required to use low-cost nonvolatile semiconductor memory devices in which typical MOS transistors are used, instead of transistors having such a high-cost stacked structure.

FIG. 7 illustrates an exemplary structure of a conventional nonvolatile semiconductor memory device in which MOS transistors are used (see Japanese Laid-Open Publication No. 2001-229690).

As shown in FIG. 7, a bit cell 100 includes a PMOS transistor 101 and a first NMOS transistor 103. The source, drain and substrate of the PMOS transistor 101 are electrically connected to form a control gate. The source of the first NMOS transistor 103 is connected to a source line SL, while the gate thereof is used in common with the PMOS transistor 101 and forms a floating gate 102.

The drain of the first NMOS transistor 103 is connected to the source of a second NMOS transistor 104, and the drain of the second NMOS transistor 104 is connected to an input node bit of a pair of serially connected inverters 105 for driving an output signal.

The input node bit is connected to a shared drain (output node) of a load transistor 106 formed of a PMOS transistor and a switch transistor 107 formed of a third NMOS transistor.

Hereinafter, it will be described how the conventional nonvolatile semiconductor memory device with the above-mentioned structure operates.

First, to write desired data into the bit cell 100, a high-level write control signal prog is applied to the gate of the switch transistor 107 in order to turn ON the switch transistor 107. Furthermore, a control gate control signal cg of 5 V, which is a relatively high voltage, is applied to the PMOS transistor (control gate) 101, and a high voltage of 5 V is also applied to the source line SL. As a result, a channel is formed in the first NMOS transistor 103 to allow the first NMOS transistor 103 to turn on. At this time, channel hot electrons are generated in the channel and part of the electrons passes through the gate oxide film of the first NMOS transistor 103 to be injected into the floating gate 102. Whether or not the charge is injected into the floating gate 102 corresponds to 1-bit data.

Next, to read the written data from the bit cell 100, a control gate control signal cg of 1 V is applied to the control gate 101, and a read permission signal tg of 1 V is applied to the second NMOS transistor. At the same time, the source line SL is put to 0 V and a read control signal /read is put to a low level (0 V) so that the load transistor 106 is turned ON so as to pass current through the source line SL.

If the electrons (charge) have been injected into the floating gate 102, the first NMOS transistor 103 is not turned ON, even if the high-level control gate control signal cg is applied, because the voltage actually applied to the floating gate 102 is at a low level. Therefore, the voltage of the input node bit of the inverter pair 105 is a high level voltage of about 1 V, thereby representing logic 1.

On the other hand, if no electrons have been injected into the floating gate 102, the application of the high-level control gate control signal cg to the control gate causes capacitive coupling between the gate capacitance of the PMOS transistor 101 and that of the first NMOS transistor 103, such that the voltage of the floating gate 102 is increased to turn ON the first NMOS transistor 103. As a result, the voltage of the input node bit of the inverter pair 105 is a low level voltage of about 0 V, thereby representing logic 0.

Since the data write operation and the data read operation are performed in this manner, the electrons injected into the floating gate 102 remain confined in the floating gate 102 even if the device is turned off. Therefore, when the power is turned on again to perform a read operation, the state of the data written based on whether or not the electrons have been injected into the floating gate 102 is determined to read the data.

However, due to the fact that the thickness of gate oxide films has been reduced as a result of the recent advancement of miniaturization, leakage of the electrons injected into the floating gate 102 has become noticeable. This causes a first problem in that the data retention characteristics of the downsized MOS transistor 103 deteriorate.

In a so-called system LSI in which a logic section and a memory section are formed on the single chip, the gate oxide film thickness of typical MOS transistors is about 2 nm, while the gate oxide film thickness of transistors in I/O circuits serving as peripheral circuits is about 7 nm in the process generation in which, e.g., the design rule is 130 nm. In such gate oxide films whose thickness is not greater than 10 nm, leakage caused by their own defects and leakage due to tunnel current increase.

Furthermore, nonvolatile memories are used not only for forming memory arrays for storing large amounts of user data, but also as peripheral circuits of system LSIs for storing system information such as the presence/absence of redundancy repair and system configuration selection, as described in the above patent publication. These peripheral circuits are often disposed near a power source on the chip, which produces a second problem in that noise generated by variation in the power source potential enters the nonvolatile memories, such that their operation is likely to become unstable.

SUMMARY OF THE INVENTION

It is therefore an object of the present invention to solve both the above-mentioned problems to improve data retention characteristics as well as to stabilize operation in a nonvolatile semiconductor memory device in which MOS transistors are used.

In order to achieve the above object, nonvolatile semiconductor memory devices of the present invention employ a structure in which a pair of bit cells, each including two MOS transistors forming a control gate and a floating gate, retains complementary data.

Specifically, an inventive nonvolatile semiconductor memory device includes: a first bit cell including a first MOS transistor which is formed on a semiconductor substrate and whose source and drain are connected to form a first control gate and a second MOS transistor which has a floating gate in common with the first MOS transistor; a second bit cell including a third MOS transistor which is formed on the semiconductor substrate and whose source and drain are connected to form a second control gate and a fourth MOS transistor which has a floating gate in common with the third MOS transistor; and a differential amplifier which is formed on the semiconductor substrate and receives input signals from drains of the respective second and fourth MOS transistors.

In the inventive nonvolatile semiconductor memory device, when data is written, electrons (charge) is selectively injected into only one of the first and second bit cells, each of which includes the control gate and the floating gate formed of the MOS transistors. And when data is read, the differential amplifier reads a difference between read currents read from both the bit cells. Then, even if leakage of the injected charge occurs, the differential amplifier compensates for the loss of the charge, so that the data retention characteristics are improved. In addition, even if noise caused by a power source, for example, enters the bit cells, the components of the noise are in phase with each other and are cancelled by the differential amplifier. Thus, even if the nonvolatile semiconductor memory device is disposed near a circuit that noise is likely to enter, the memory device operates in a stable manner.

In the inventive nonvolatile semiconductor memory device, each of the first and third MOS transistors is preferably a PMOS transistor and a substrate potential of the PMOS transistor is preferably equal to potentials of the source and drain of the PMOS transistor. Then, if the semiconductor substrate exhibits p-type conductivity, which is typically employed, it is easier to form an N-type well capable of having an isolated substrate potential in the semiconductor substrate.

In this case, the first and third MOS transistors preferably share a well formed in the semiconductor substrate. Then, the layout area is reduced reliably.

In the inventive nonvolatile semiconductor memory device, when data is read from the first and second bit cells, identical current loads are preferably connected to the differential amplifier.

In the inventive nonvolatile semiconductor memory device, when data is written into the first or second bit cell, the second or fourth MOS transistor is preferably turned on, thereby producing hot carriers in a channel in a conducting MOS transistor among the second and fourth MOS transistors and injecting the electrons into the floating gate of the conducting MOS transistor.

Then, by turning on the first or third MOS transistor, hot carriers are produced and the electrons are injected into the floating gate, thereby allowing the desired data to be stored.

In the inventive nonvolatile semiconductor memory device, the first bit cell includes, between a drain of the second MOS transistor and the differential amplifier, a fifth MOS transistor whose gate is connected to the first control gate; and the second bit cell includes, between a drain of the fourth MOS transistor and the differential amplifier, a sixth MOS transistor whose gate is connected to the second control gate.

Then, in a case where the first control gate is non-active, for example, if the drain of the second MOS transistor, in which charge is retained, is put to a floating state, the electric field strength (stress) between the gate and drain of the second MOS transistor is relieved to suppress leakage of the charge, thereby achieving more excellent data retention characteristics.

In the inventive nonvolatile semiconductor memory device, a plurality of cell pairs are preferably arranged in rows and columns on the semiconductor substrate, each cell pair including the first bit cell and the second bit cell. The inventive device preferably further includes: a plurality of control gate lines each connected to corresponding ones of the first and second control gates in the cell pairs, the corresponding first and second control gates being arranged in a row direction; a plurality of first bit lines each connected to drains of corresponding ones of the second MOS transistors in the cell pairs, the corresponding second MOS transistors being arranged in a column direction; and a plurality of second bit lines each connected to drains of corresponding ones of the fourth MOS transistors in the cell pairs, the corresponding fourth MOS transistors being arranged in a column direction. And in the inventive device, the differential amplifier is preferably provided plural in number for receiving input signals from the first and second bit lines.

Then, a memory cell array is obtained from the cell pairs including the first and second bit cells.

In this case, the first and second control gates in the cell pairs arranged in the row direction are preferably formed in a common well in the semiconductor substrate.

Furthermore, in this case, the first and second control gates in each of the cell pairs are preferably formed so as to be shared by each other.

Moreover, in this case, the well of the first and second control gates in each of the cell pairs is preferably formed so as to be shared by the first and second control gates.

Then, the first and second control gates in each cell pair, that is, the first and third MOS transistors, are arranged symmetrically on the semiconductor substrate, thereby allowing a compact arrangement of the resultant memory cell array.

In the nonvolatile semiconductor memory device, the MOS transistors included in the first and second bit cells are preferably formed in the same process step as MOS transistors included in input/output cells in a system LSI.

Then, the inventive nonvolatile semiconductor memory device is realized at low cost.

DESCRIPTION OF THE PREFERRED EMBODIMENTS (First Embodiment)

Hereinafter, a first embodiment of the present invention will be described with reference to the accompanying drawings.

Figure 1:
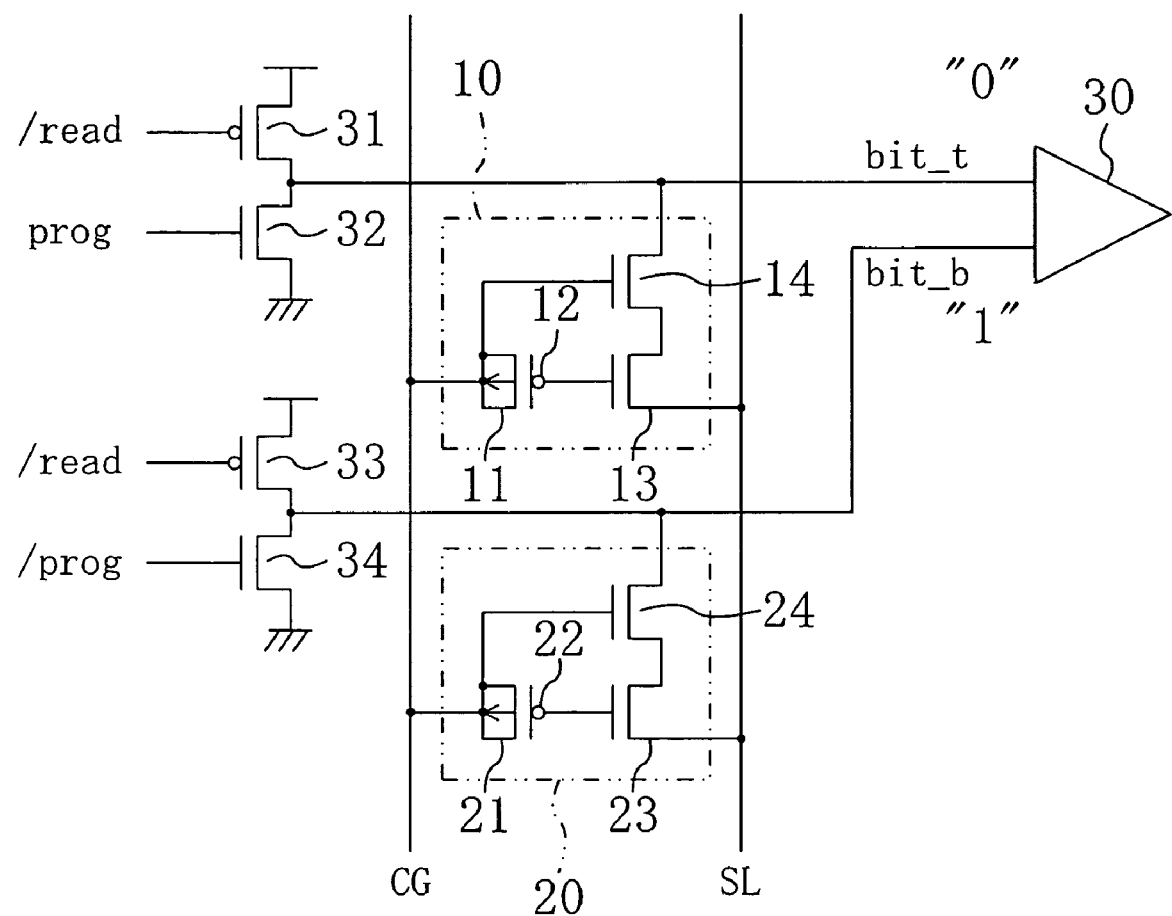
FIG. 1 is a circuit diagram illustrating the main part of a nonvolatile semiconductor memory device in accordance with a first embodiment of the present invention.

FIG. 1 illustrates the main part of a nonvolatile semiconductor memory device in accordance with the first embodiment of the present invention. As shown in FIG. 1, the nonvolatile semiconductor memory device of the first embodiment includes a first bit cell 10, a second bit cell 20, and a differential amplifier 30 for receiving output signals from the first and second bit cells 10 and 20.

The first bit cell 10 includes a first PMOS transistor 11, a first NMOS transistor 13, and a second NMOS transistor 14. The source, drain and substrate of the first PMOS transistor 11 are electrically connected to form a first control gate. The source of the first NMOS transistor 13 is connected to a source line SL, while the gate thereof is used in common with the first PMOS transistor 11 and forms a floating gate 12. The gate of the second NMOS transistor 14 is connected to the source and drain (first control gate) of the first PMOS transistor 11. The source of the second NMOS transistor 14 is connected to the drain of the first NMOS transistor 13, while the drain of the second NMOS transistor 14 is connected to a first input node bit_t of the differential amplifier 30.

The second bit cell 20 includes a second PMOS transistor 21, a third NMOS transistor 23, and a fourth NMOS transistor 24. The source, drain and substrate of the second PMOS transistor 21 are electrically connected to form a second control gate. The source of the third NMOS transistor 23 is connected to the source line SL, while the gate thereof is used in common with the second PMOS transistor 21 and forms a floating gate 22. The gate of the fourth NMOS transistor 24 is connected to the source and drain (second control gate) of the second PMOS transistor 21. The source of the fourth NMOS transistor 24 is connected to the drain of the third NMOS transistor 23, while the drain of the fourth NMOS transistor 24 is connected to a second input node bit_b of the differential amplifier 30.

The first input node bit_t is connected to an output node of a shared drain of a first load transistor 31 and a first switch transistor 32. The first load transistor 31, which is formed of a PMOS transistor, supplies read current to the first bit cell 10 when data is read. The first switch transistor 32, which is formed of an NMOS transistor, controls current flowing through the first bit cell 10 when data is written.

The second input node bit_b is connected to an output node of a shared drain of a second load transistor 33 and a second switch transistor 34. The second load transistor 33, which is formed of a PMOS transistor, supplies read current to the second bit cell 20 when data is read. The second switch transistor 34, which is formed of an NMOS transistor, controls current flowing through the second bit cell 20 when data is written.

The control gates 11 and 21 of the respective first and second bit cells 10 and 20 are connected to a control gate control line CG.

Hereinafter, it will be described how the nonvolatile semiconductor memory device with the above-mentioned structure operates.

First, desired data is written to the first and second bit cells 10 and 20. In this embodiment, assume that "0" and "1" are written to the first and second bit cells 10 and 20, respectively.

Specifically, a low-level write control signal prog is applied to the gate of the first switch transistor 32, while a high-level complementary write control signal /prog, which is complementary to the write control signal prog, is applied to the gate of the second switch transistor 34.

Then, a relatively high voltage of, e.g., 5 V is applied as a write voltage to each of the control gate control line CG and the source line SL. This allows the third NMOS transistor 23 included in the second bit cell 20 to turn on and have low impedance. At this time, channel hot electrons are generated in the formed channel and part of the electrons passes through the gate oxide film of the third NMOS transistor 23 and is injected into the floating gate 22.

As described above, when data is written selectively to the second bit cell 20, charge is accumulated in the floating gate 22. The first NMOS transistor 13 in the first bit cell 10, on the other hand, does turn on, because the first switch transistor 32 is in the OFF-state and has high impedance. Thus, no hot electrons are produced and no charge is injected into the floating gate 12. The charge injected into the floating gate 22 in the second bit cell 20 will be retained in the floating gate 22 unless the charge is erased.

Next, it will be explained how to read the data stored in the first and second bit cells 10 and 20.

First, a read control signal /read at a low-level (0V) is applied to the gates of the respective first and second load transistors 31 and 33 to turn ON the first and second load transistors 31 and 33. Then, the potential of the source line SL is put to a low level, while a high-level voltage of, e.g., 1V is applied to the control gate control line CG. At this time, if the floating gate 22 in the second bit cell 20 retains charge, the third NMOS transistor 23 in the second bit cell 20 does not turn on and remains in the OFF-state, even if the potential of the control gate control line CG is put to the high level (1V), because the injected charge makes the voltage of the floating gate 22 be lower than a specific threshold voltage Vtn2 of the third NMOS transistor 23.

On the other hand, the first NMOS transistor 13 in the first bit cell 10, in which no charge has been injected, is turned ON, when the potential of the control gate control line CG changes to the high level, because the voltage of the floating gate 12 exceeds a specific threshold voltage Vtn1 of the first NMOS transistor 13 due to the capacitive coupling of the first PMOS transistor 11 and the first NMOS transistor 13.

As a result, load current supplied via the first load transistor 31 to the first bit cell 10 flows through the source line SL via the first and second NMOS transistors 13 and 14, so that the voltage V(bit_t) of the first input node is substantially put to the low level, which corresponds to the logic 0.

On the other hand, load current supplied via the second load transistor 33 to the second bit cell 20 does not flow through the source line SL because of the third NMOS transistor 23 being in the OFF-state. Consequently, the voltage V(bit_b) of the second input node is substantially put to the high level, which corresponds to the logic 1. Therefore, the expression V(bit_t)<V(bit_b) is obtained by comparing the voltage of the first input node bit_t and that of the second input node bit_b, thereby allowing the differential amplifier 30 to read the voltage difference between the first input node bit_t and the second input node bit_b.

Figure 2:
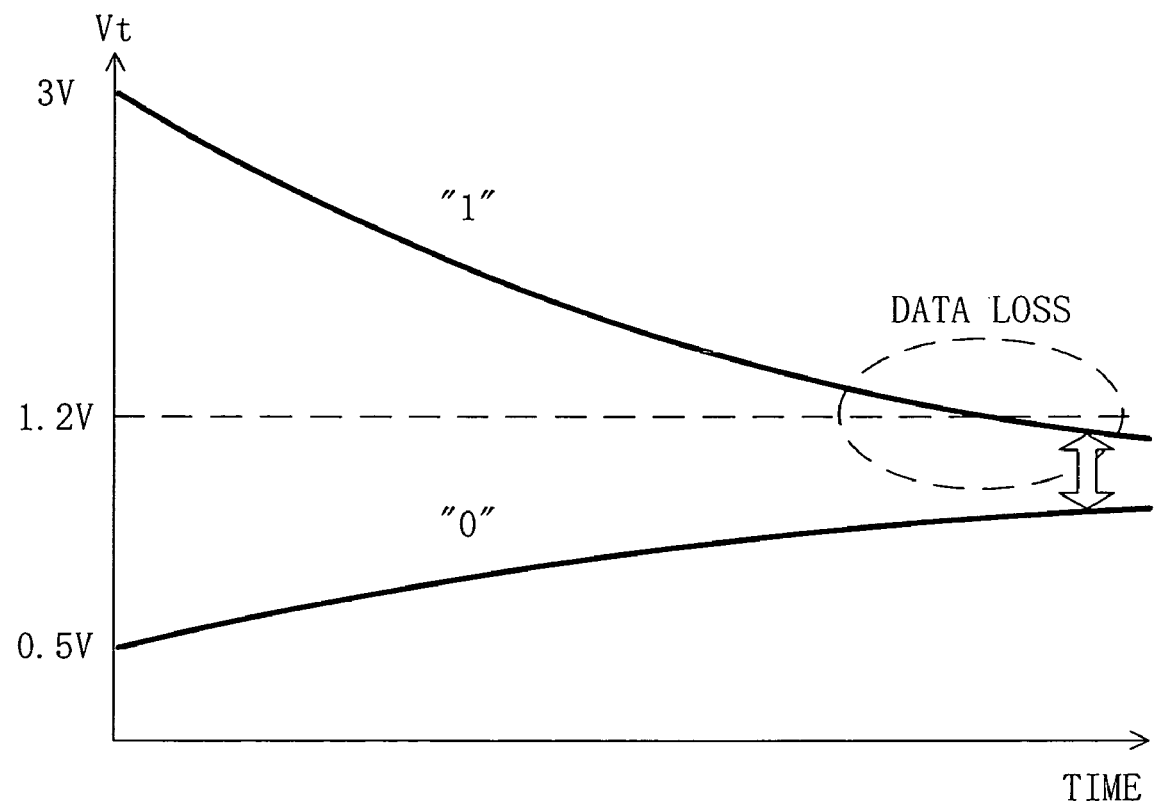
FIG. 2 is a graph illustrating data retention characteristics in the nonvolatile semiconductor memory device of the first embodiment of the present invention.

As shown in FIG. 2, the charge retained in the floating gates 12 and 22 is lost with time due to defects of the gate oxide films or the like. In FIG. 2, the ordinate indicates the threshold voltage Vt at which the NMOS transistors 13 and 23 are turned ON, while the abscissa represents time. As can be seen from FIG. 2, the initial value of the threshold voltage in the bit cell into which charge has been injected is 3V, while the initial value of the threshold voltage in the bit cell into which no charge has been injected is 0.5V. However, as the time passes, the charge in the bit cell having the injected charge is lost gradually, while the threshold voltage of the bit cell having no injected charge remains the same or charge is gradually injected into the bit cell due to reverse leakage.

Nevertheless, in the first embodiment, the data to be read externally is determined as the difference between the output voltage Vbit_t from the first bit cell 10 and the output voltage V bit_b from the second bit cell 20. Therefore, even if the threshold voltage of the second bit cell 20, for example, is reduced due to the loss of the charge, more specifically, even if the threshold voltage is reduced below 1.2 V, the desired data can be read, which means that the desired data has been retained, so long as the reduced threshold voltage is higher than the threshold voltage of the second bit cell 20.

In the case of the conventional example in which data to be read externally is determined by the inverters 105, if the threshold voltage of the bit cell 100 is decreased below 1.2V due to leakage of the charge, for example, the data is determined as logic 0, leading to a malfunction.

In the first embodiment, the first and second bit cells 10 and 20 have the same shape and are fabricated in the same process steps, so there is no big difference in charge leakage characteristics between the first and second bit cells 10 and 20. Therefore, the possibility that read data has the opposite polarity to that of the retained data is extremely low.

As described above, in the first embodiment, the low-cost nonvolatile semiconductor memory device formed in the typical MOS process has very excellent data retention characteristics. In addition, even if noise caused by a power source, for example, enters the bit cells 10 and 20, the components of the noise are in phase with each other and are cancelled by the differential amplifier 30. Thus, even if the nonvolatile semiconductor memory device is disposed near a circuit that noise is likely to enter, the nonvolatile semiconductor memory device operates in a very stable manner.

In addition, the second and fourth NMOS transistors 14 and 24, whose respective gates are connected to the control gates 11 and 21, are added to the bit cells 10 and 20, respectively. In operations other than read operations, these NMOS transistors 14 and 24 are in the OFF-state, such that the drains of the first and third NMOS transistors 13 and 23 in which charge is retained are put to a floating state. As a result, no voltage stress is applied between the gate and drain of each NMOS transistor 13 and 23, which suppresses leakage of the charge from the drain, thereby further improving the data retention characteristics.

(Second Embodiment)

Hereinafter, a second embodiment of the present invention will be described with reference to the accompanying drawings.

Figure 3:
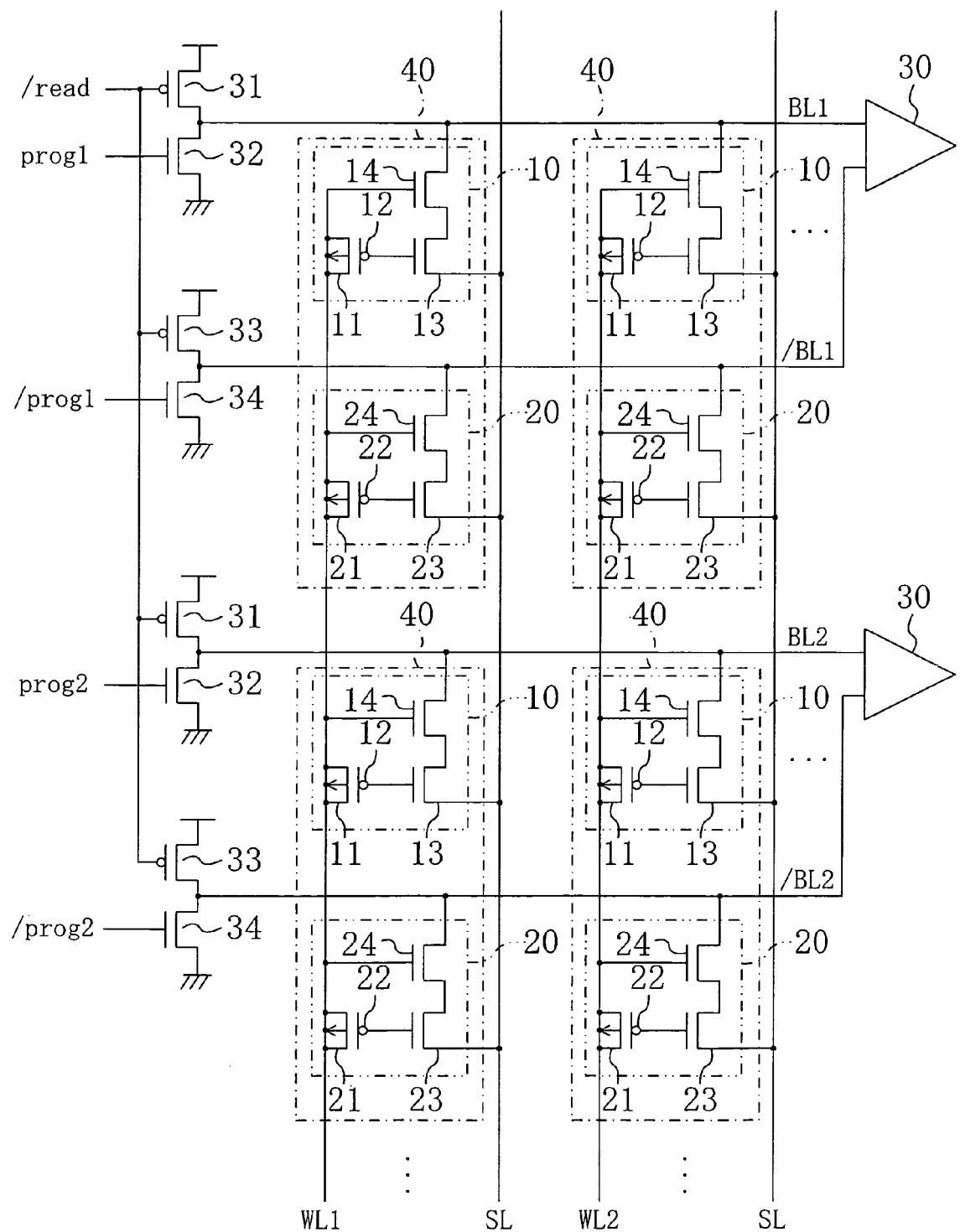
FIG. 3 is a circuit diagram illustrating the main part of a nonvolatile semiconductor memory device in accordance with a second embodiment of the present invention.

FIG. 3 illustrates the main part of a nonvolatile semiconductor memory device in accordance with the second embodiment of the present invention. In FIG. 3, the same members as those shown in FIG. 1 are identified by the same reference numerals and the description thereof will be omitted herein.

As shown in FIG. 3, the nonvolatile semiconductor memory device of the second embodiment is characterized in that pairs of cells 40, each including a first bit cell 10 and a second bit cell 20 configured in the same manner as in the first embodiment, are arranged in a matrix.

First and second PMOS transistors (first and second control gates) 11 and 21 in the cell pairs 40, arranged on the same row, are connected to a corresponding one of word lines such as WL1 and WL2. Each word line WL1 and WL2 corresponds to the control gate control line CG of the first embodiment.

The drains of first NMOS transistors 13 in the cell pairs 40, arranged on the same column, are connected via second NMOS transistors 14 to a corresponding one of bit lines such as BL1 and BL2. The drains of third NMOS transistors 23, arranged on the same column, are connected via fourth NMOS transistors 24 to a corresponding one of complementary bit lines such as /BL1 and /BL2.

One end of each of the bit line BL1 and complementary bit line /BL1, for example, which form a bit line pair, is connected to an input terminal of a differential amplifier 30. The other end of the bit line BL1 is connected to an output node of a first load transistor 31 and a first switch transistor 32, while the other end of the complementary bit line /BL1 is connected to an output node of a second load transistor 33 and a second switch transistor 34.

Hereinafter, it will be described how the nonvolatile semiconductor memory device having the above-mentioned structure operates.

First, a write operation will be explained.

Assume that the word line WL1 and a complementary write control signal /prog1 have been selected externally, a write voltage of 5V has been applied to each of the selected word line WL1 and a source line SL, and at the same time the complementary write control signal /prog1 has changed to a high level. As a result, in the second bit cell 20 connected to the word line WL1 and the complementary bit line /BL1, write current flows from the source of the third NMOS transistor 23 via the fourth NMOS transistor 24 through the complementary bit line /BL1. At this time, as described above, channel hot electors are generated in the channel in the third NMOS transistor 23 to cause injection of charge into the floating gate 22, thereby allowing the data to be written. On the other hand, in the other bit cells 10 and 20 connected to the other word lines, such as WL2, which are in the non-selected state, the second and fourth NMOS transistors 14 and 24 are all in the OFF-state. Therefore, no write current flows and no charge is thus injected into the floating gates 12 and 22 in those other bit cells 10 and 20.

Next, a read operation will be discussed.

First, a low-level (0V) read control signal /read is applied to the gates of the respective first and second load transistors 31 and 33 to turn ON the first and second load transistors 31 and 33. Furthermore, the potential of the source line SL is put to a low level, while a high-level voltage of, e.g., 1V is applied to the selected word line WL1. This allows current to pass through the bit cell 10 or 20 connected to the selected word line WL1. If charge has been injected into the floating gate 22 in the second bit cell 20, as described above, a potential difference is generated between the complementary bit line /BL1 connected to the second bit cell 20 and the bit line BL1 connected to the first bit cell 10 into which no charge has been injected. This potential difference is read as data by the differential amplifier 30.

At this time, the other bit cells 10 and 20 connected to the non-selected word line WL2, in which the second and fourth NMOS transistors 14 and 24 are in the OFF-state, are not electrically connected to the bit line pairs such as BL1 and /BL1 and BL2 and /BL2. The non-selected bit cells 10 and 20 therefore do not affect the bit line pairs such as BL1 and /BL1. For instance, even if the first NMOS transistors 13 in the non-selected bit cells 10 connected with the word line WL2 have a low threshold voltage and are turned on, with the potential of the word line WL2 being 0V, the bit lines BL1 and BL2 are not connected to the source line SL, because the second NMOS transistors 14 are in the OFF-state.

As described above, in the second embodiment, the cell pairs 40, which are composed of the bit cells 10 and 20 each including three MOS transistors, are arranged in rows and columns and connected to the common word lines such as WL1 and WL2 provided for the respective rows and to the common bit lines such as BL1 and /BL1 provided for the respective columns. This configuration allows the sharing of the differential amplifier 30, data read circuits (that is, load transistors 31 and 33) and data write circuits (that is, switch transistors 32 and 34). Accordingly, the nonvolatile semiconductor memory device is realized at low cost by the MOS process without causing an increase in the layout area on the chip.

Figure 4:
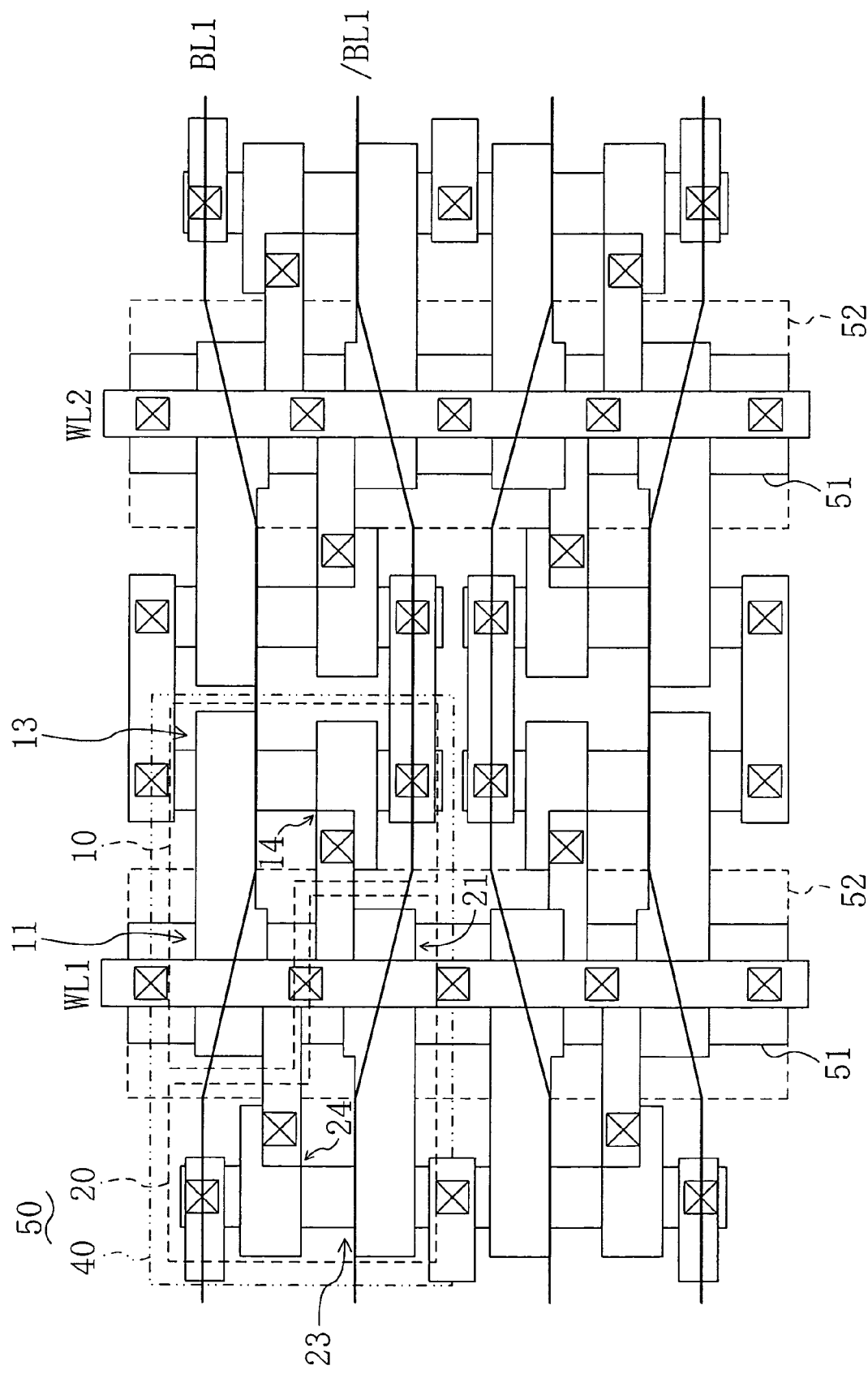
FIG. 4 is a plan view illustrating a layout of the nonvolatile semiconductor memory device of the second embodiment of the present invention.

FIG. 4 illustrates an exemplary layout configuration in which the cell pairs 40 of the second embodiment are arranged on a semiconductor substrate 50. As shown in FIG. 4, active layers 51 and n-type wells 52, in which the first and second PMOS transistors 11 and 21 connected to the word line WL1, for example, are formed, are arranged consecutively along the word line WL1. This eliminates the need for forming isolation regions in the PMOS transistors 11 and 21 in the cell pairs 40 formed in the row direction, thereby suppressing an increase in the layout area on the chip.

(Modified Example of Second Embodiment)

Hereinafter, a modified example of the second embodiment of the present invention will be described with reference to the accompanying drawings.

Figure 5:
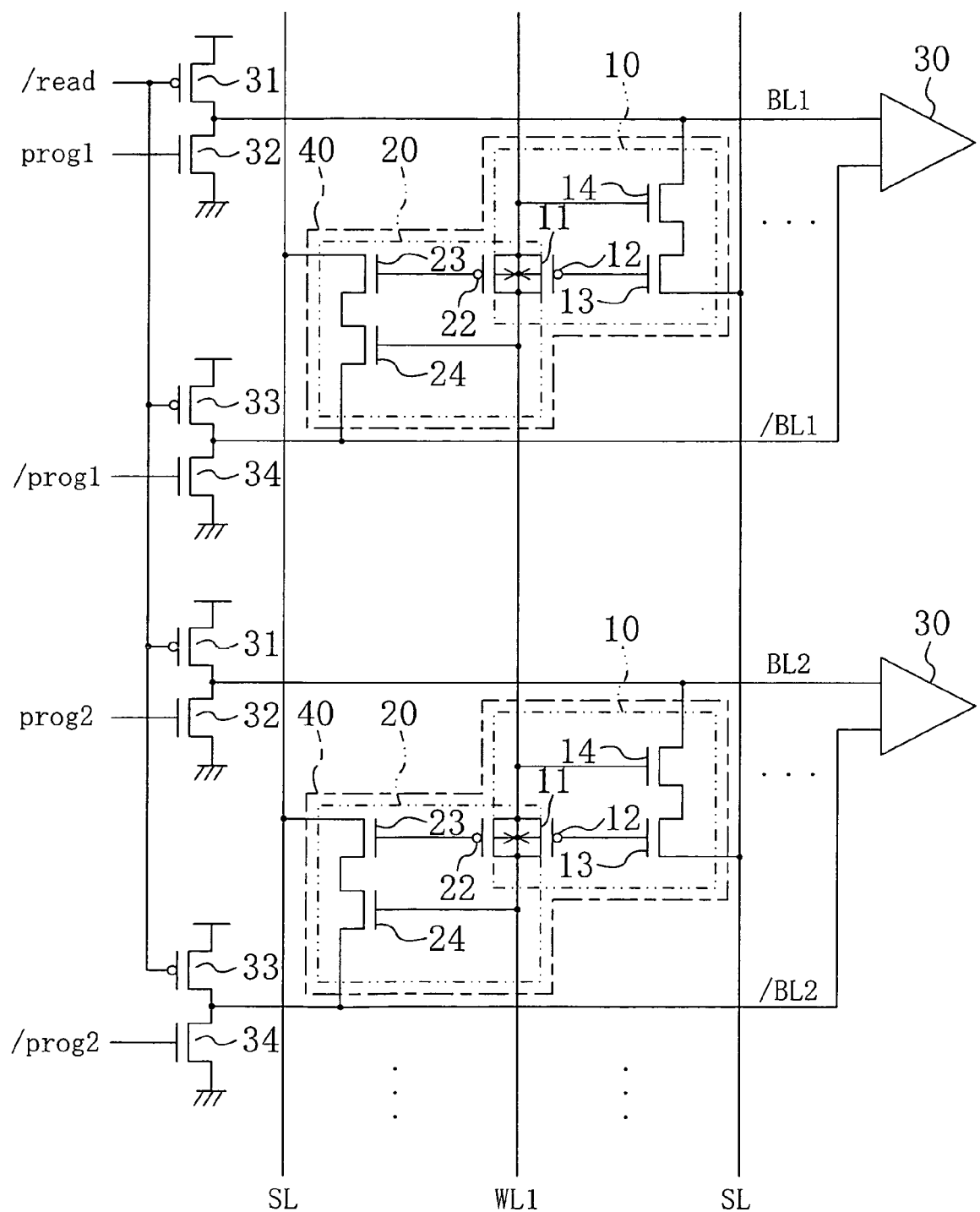
FIG. 5 is a circuit diagram illustrating the main part of a nonvolatile semiconductor memory device in accordance with a modified example of the second embodiment of the present invention.

FIG. 5 illustrates the main part of a nonvolatile semiconductor memory device in accordance with the modified example of the second embodiment of the present invention. In FIG. 5, the same members as those shown in FIG. 3 are identified by the same reference numerals and the description thereof will be omitted herein.

As shown in FIG. 5, the modified example differs from the second embodiment in that the modified example employs a structure in which the cell pairs 40 for storing complementary data use, e.g., a word line WL1 in common.

Figure 6:
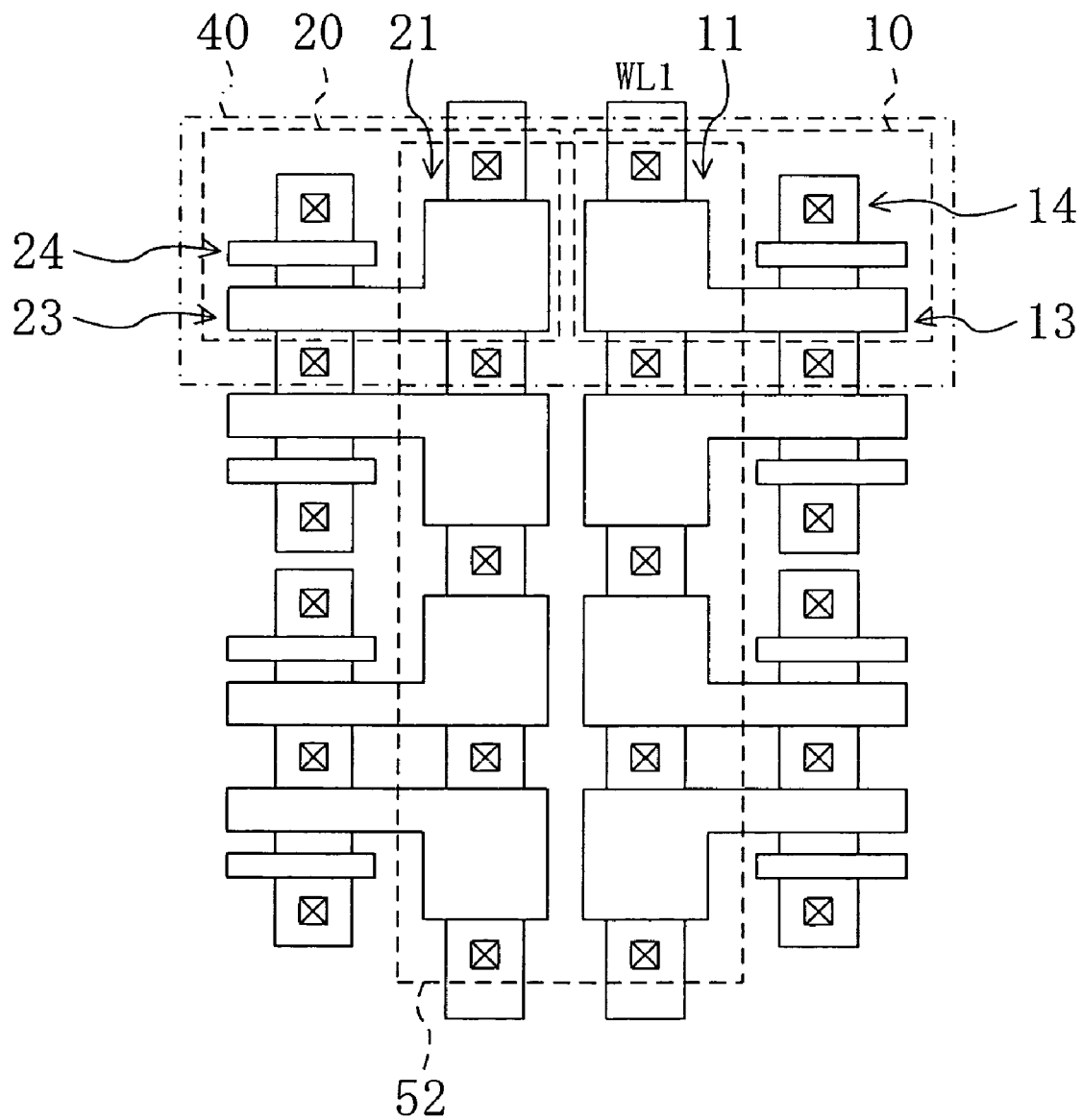
FIG. 6 is a plan view illustrating a layout of the nonvolatile semiconductor memory device of the modified example of the second embodiment of the present invention.
Figure 7:
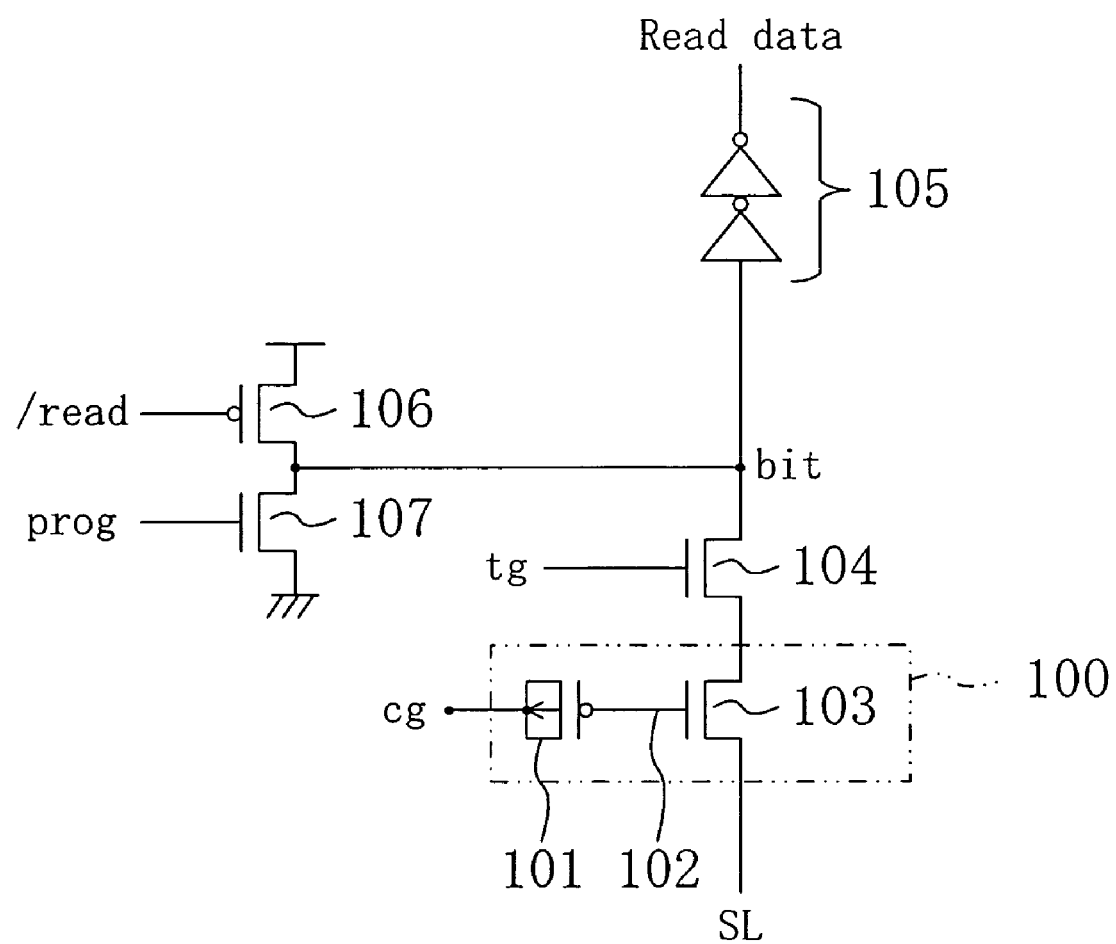
FIG. 7 is a circuit diagram illustrating the main part of a conventional nonvolatile semiconductor memory device in which MOS transistors are used.

FIG. 6 illustrates an exemplary layout configuration in which the cell pairs 40 of the modified example are arranged on a semiconductor substrate 50. As shown in FIG. 6, the first and second PMOS transistors 11 and 21 included in the cell pairs 40 are provided in a common N-type well 52, thereby further reducing the cell area.

In the second embodiment and the modified example thereof, the MOS transistors 11 and 12 and the like that form the first and second bit cells 10 and 20 are preferably formed in the same process step as, e.g., MOS transistors included in input/output (I/O) cells of the system LSI. Then, the system LSI including the nonvolatile semiconductor memory device composed of the MOS transistors is realized at lower cost.

In the second embodiment and the modified example thereof, the cell pairs 40 may be used not only for forming a memory cell array for retaining user data, but also as peripheral circuits for retaining system information, for example, as circuits for holding redundancy repair data in a typical memory cell array. In that case, even if the nonvolatile semiconductor memory device is disposed near a power supply circuit that noise is likely to enter, the nonvolatile semiconductor memory device operates in a stable manner, because the difference-amplification structure is employed.

As described above, the nonvolatile semiconductor memory devices of the present invention have improved data retention characteristics, and operate in a stable manner even if they are disposed near circuits that noise is likely to enter. The inventive nonvolatile semiconductor memory devices therefore function effectively as, e.g., nonvolatile semiconductor memory devices which include MOS transistors.

What is claimed is:

1. A nonvolatile semiconductor memory device comprising:
a first bit cell including a first MOS transistor which is formed on a semiconductor substrate and whose source and drain are connected to form a first control gate and a second MOS transistor which has a floating gate in common with the first MOS transistor;
a second bit cell including a third MOS transistor which is formed on the semiconductor substrate and whose source and drain are connected to form a second control gate and a fourth MOS transistor which has a floating gate in common with the third MOS transistor; and
a differential amplifier which is formed on the semiconductor substrate and receives input signals from drains of the respective second and fourth MOS transistors.

2. The device of claim 1, wherein each of the first and third MOS transistors is a PMOS transistor and a substrate potential of the PMOS transistor is equal to potentials of the source and drain of the PMOS transistor.

3. The device of claim 2, wherein the first and third MOS transistors share a well formed in the semiconductor substrate.

4. The device of claim 1, wherein when data is read from the first and second bit cells, identical current loads are connected to the differential amplifier.

5. The device of claim 1, wherein when data is written into the first or second bit cell, the second or fourth MOS transistor is turned on, thereby producing hot carriers in a channel in a conducting MOS transistor among the second and fourth MOS transistors and injecting the electrons into the floating gate of the conducting MOS transistor.

6. The device of claim 1, wherein
the first bit cell includes, between a drain of the second MOS transistor and the differential amplifier, a fifth MOS transistor whose gate is connected to the first control gate; and
the second bit cell includes, between a drain of the fourth MOS transistor and the differential amplifier, a sixth MOS transistor whose gate is connected to the second control gate.

7. The device of claim 1, wherein
a plurality of cell pairs are arranged in rows and columns on the semiconductor substrate, each cell pair including the first bit cell and the second bit cell;
the device further includes:
a plurality of control gate lines each connected to corresponding ones of the first and second control gates in the cell pairs, the corresponding first and second control gates being arranged in a row direction;

a plurality of first bit lines each connected to drains of corresponding ones of the second MOS transistors in the cell pairs, the corresponding second MOS transistors being arranged in a column direction; and a plurality of second bit lines each connected to drains of corresponding ones of the fourth MOS transistors in the cell pairs, the corresponding fourth MOS transistors being arranged in a column direction; and the differential amplifier is provided plural in number for receiving input signals from the first and second bit lines.

8. The device of claim 7, wherein the first and second control gates in the cell pairs arranged in the row direction are formed in a common well in the semiconductor substrate.

9. The device of claim 8, wherein the first and second control gates in each of the cell pairs are formed so as to be shared by each other.

10. The device of claim 9, wherein the well of the first and second control gates in each of the cell pairs is formed so as to be shared by the first and second control gates.

11. The device of claim 1, wherein the MOS transistors included in the first and second bit cells are formed in the same process step as MOS transistors included in input/output cells in a system LSI.

* * * * *

UNITED STATES PATENT AND TRADEMARK OFFICE
CERTIFICATE OF CORRECTION

| | | |
|---|---|---|
| PATENT NO. | : 7,002,865 B2 | Page 1 of 1 |
| APPLICATION NO. | : 10/935278 | |
| DATED | : February 21, 2006 | |
| INVENTOR(S) | : Masashi, Agata et al. | |

It is certified that error appears in the above-identified patent and that said Letters Patent is hereby corrected as shown below:

On the Title page

Under section "(56) References Cited", please add -- FOREIGN PATENT DOCUMENTS, JP 2001-229690 8/2001 --

Signed and Sealed this

Twenty-fifth Day of July, 2006

JON W. DUDAS
*Director of the United States Patent and Trademark Office*